Jan. 30, 1968 T. D. SMITH 3,365,962

UHF TUNER MECHANISM

Filed Nov. 26, 1965 4 Sheets-Sheet 1

INVENTOR.
THEODORE D. SMITH
BY Eugene M. Whitacre
Attorney

INVENTOR.
THEODORE D. SMITH
BY Eugene M. Whitacre
Attorney

INVENTOR.
THEODORE D. SMITH
BY Eugene M. Whitacre
Attorney

UHF TUNER MECHANISM

Filed Nov. 26, 1965 4 Sheets-Sheet 4

INVENTOR.
THEODORE D. SMITH
BY
Eugene M. Whitacre
Attorney

United States Patent Office 3,365,962
Patented Jan. 30, 1968

3,365,962
UHF TUNER MECHANISM

Theodore D. Smith, Indianapolis, Ind., assignor to Radio Corporation of America, a corporation of Delaware
Filed Nov. 26, 1965, Ser. No. 509,852
10 Claims. (Cl. 74—10.15)

The present invention relates to tuning mechanisms and more particularly to step-by-step detented type action tuning mechanisms for ultrahigh frequency tuners.

Present authorization for the transmission of television signals includes 12 channels in the very high frequency (VHF) band and 70 channels in the ultrahigh frequency (UHF) band. Many receivers manufactured for home use include step-by-step tuning of the VHF television channels, and continuous tuning of the UHF channels. With increased numbers of UHF stations being employed, it is desirable, from the consumer's and the broadcaster's points of view, to provide the same general type of tuning operation for UHF channels as for the VHF channels. From VHF tuning methods, it has become clear that a step-by-step detent type of action is desirable.

The detenting of UHF tuners involves such problems as 70 channel indexing; maintenance of required linearity accuracy; and economical fabrication.

It is an object of this invention to provide an improved television tuner mechanism.

It is also an object of this invention to provide an improved step-by-tep ultrahigh frequency television tuner mechanism tunable to any one of the seventy ultrahigh frequency channels.

A further object of this invention is to provide an improved step-by-step ultrahigh frequency television tuner mechanism capable of maintaining required linearity and of providing economical fabrication.

Yet another object of this invention is to provide an improved step-by-step UHF tuner mechanism which provides positive detented action at each and every of the 70 UHF channels, and which has an indicating assembly for displaying the number of the selected channel.

Assuming that in any given location the useable UHF signals could be located at any of the 70 UHF channels, the UHF tuner may be provided with seventy equally spaced detent stop positions, each of which receives one UHF channel.

In accordance with the invention, a tuner having an adjustable tuning shaft and a detented rotary turret are provided. A coupling means couples the rotation of the turret with the tuner control shaft. The detenting action is such as to provide a separate equally spaced detent stop position for each of the 70 UHF channels. To effect fine tuning between each detented position, a planetary gearing means is connected to the turret and the coupling means. In addition, an indicating assembly and means for synchronizing the operation of the turret and the indicating assembly are provided to indicate the selected channel number.

The invention will be further understood from the following description considered in connection with the accompanying drawings, in which.

Figure 1:
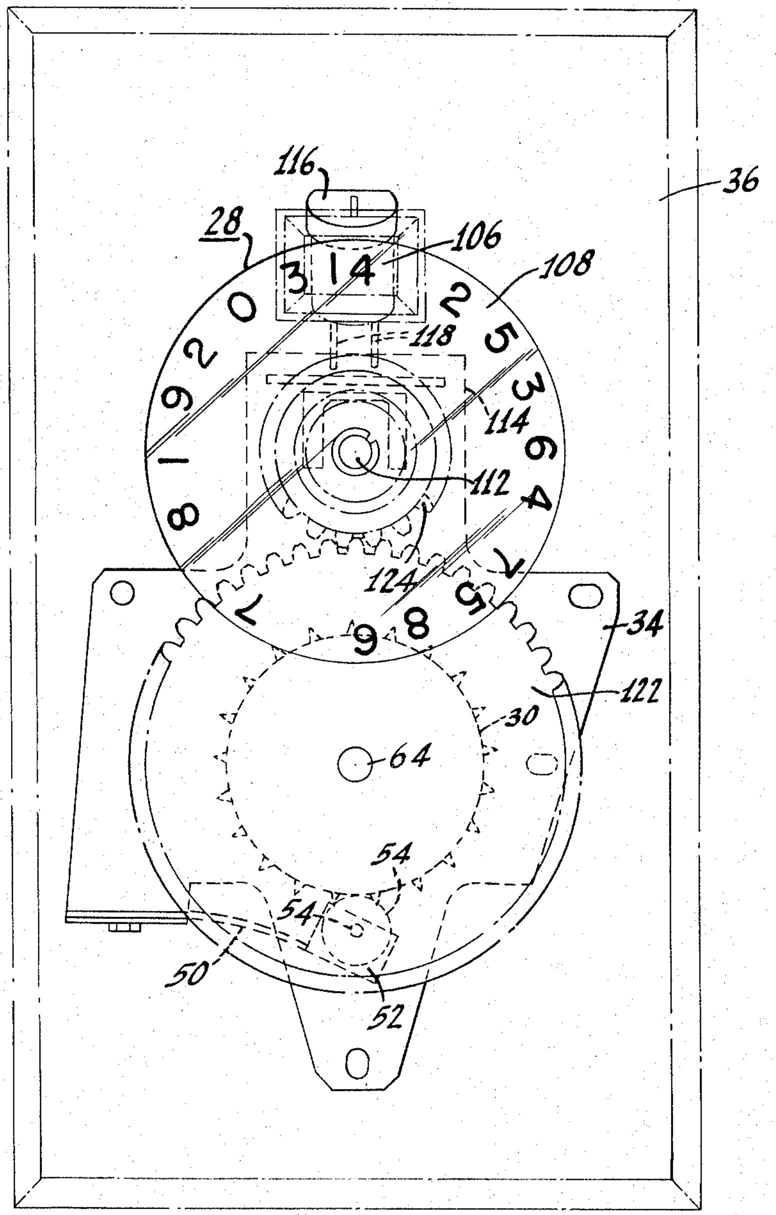
FIGURE 1 is a front view of the tuning mechanism for a UHF television tuner embodying the invention.
Figure 2:
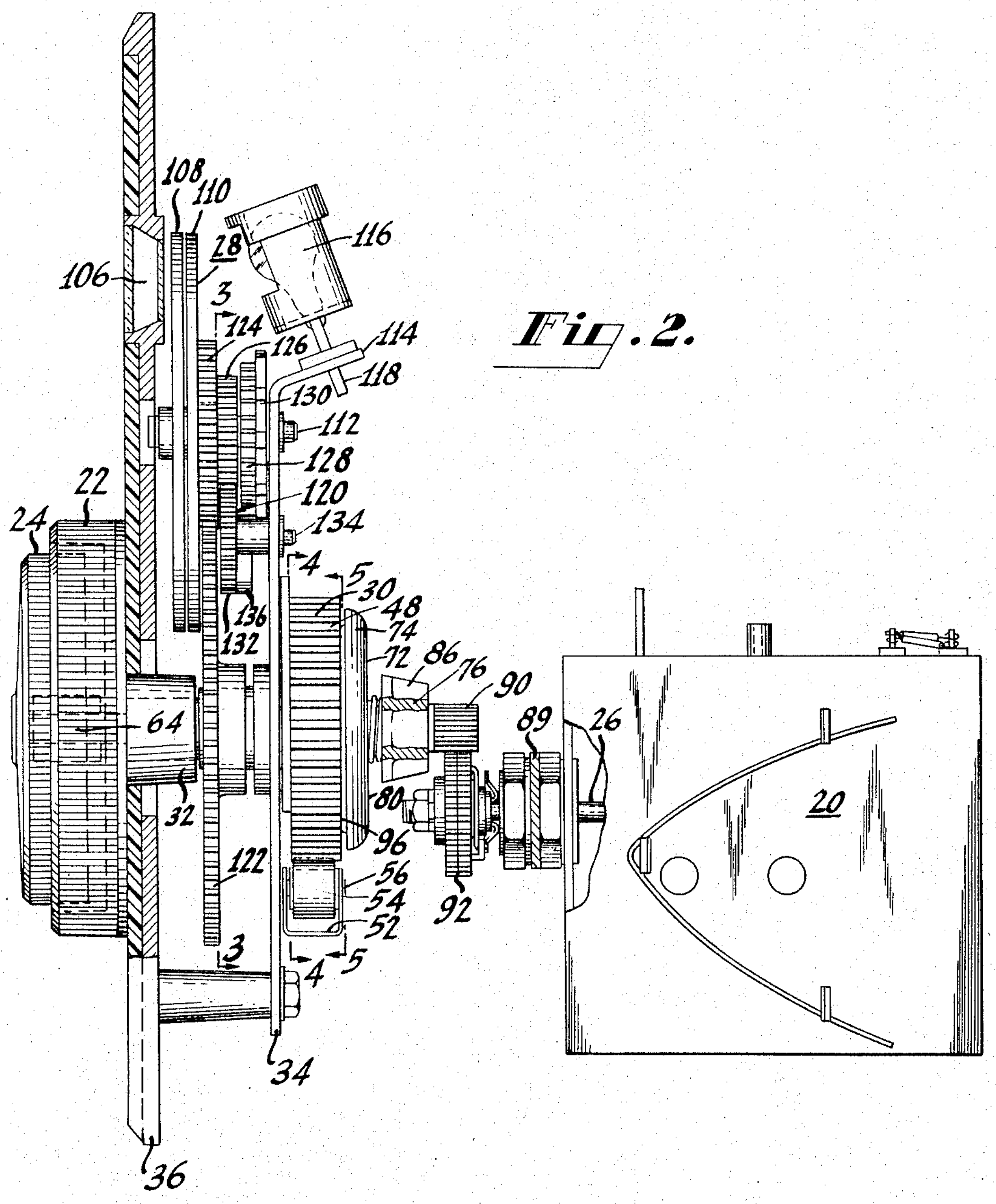
FIGURE 2 is a side view of the tuning mechanism of FIGURE 1.

Referring to the drawings, wherein the like elements and parts are designated by the like reference characters throughout the various figures, and referring particularly to FIGURE 2, it will be seen that the tuning mechanism includes an ultrahigh frequency tuner 20 having a rotatable tuner control shaft 26, adjustable to tune the UHF tuner to any of the UHF television channels, and being suitably mounted for tuning by a control knob 22 and a fine tuning knob 24. The tuner 20 is of the type which covers the entire UHF television band for 180° of the rotation of the tuner shaft.

The tuner 20 is rough tuned to a portion of the band in which the desired channel is located by turning the control knob 22 and observing a channel indicator assembly 28. Fine tuning of each channel is then accomplished by the knob 24.

Figure 3:
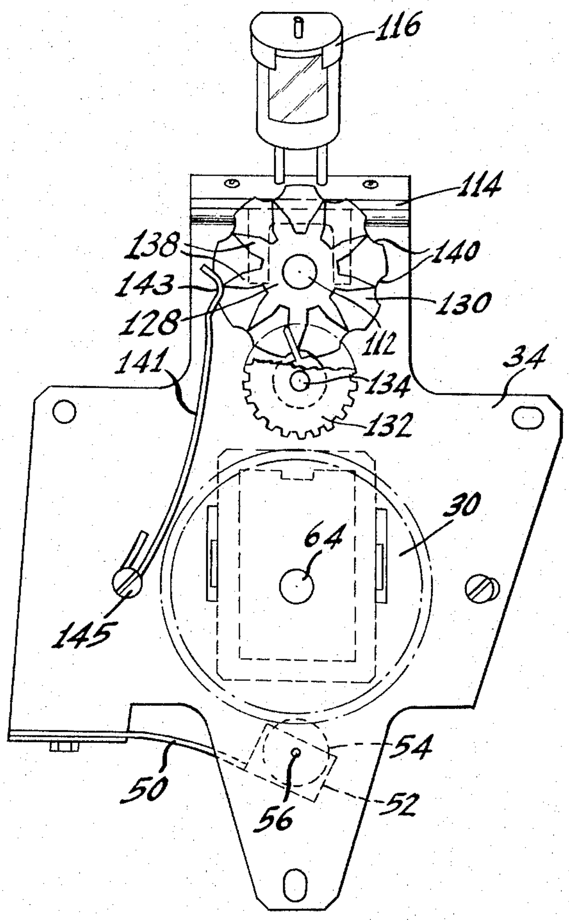
FIGURE 3 is a sectional view of the tuning mechanism taken on section lines 3—3 of FIGURE 2.

The knob 22 is connected to a rotary turret 30 by a hub 32 which is integral with the turret 30 and which extends between a front mounting plate 34 and a faceplate 36. One complete rotation of the knob 22 rotates the turret 30 through one revolution. The turret 30 has a spiral groove 38 (see FIGURE 4) in the face thereof nearest the front mounting plate 34. Between the turret 30 and the plate 34 is a flat member 40 having a projection 42 which is carried in and follows the curvature of the spiral groove 38 of the turret 30 as the turret is rotated. The member 40 is secured against the plate 34 by a pair of flanges, each of which is carried in a vertically positioned slot in the plate 34. (The flanges and slots are shown in FIGURE 3 of the drawings.) The projection 42 limits the rotation of the turret 30 in both directions when ends 44 and 46 of the spiral groove 38 are reached during rotation of the turret 30. When the end 44 of spiral groove 38 strikes the projection 42, any further rotation in that direction is prevented and the same is true when the end 46 of the groove 38 strikes the projection 42. Thus, the projection 42 and spiral groove 38 act as limiting means for limiting the rotation of the turret 30 in either direction.

The rotary turret 30 is provided with twenty-four detent notches 48 equally spaced over 360° of the periphery of the turret. Thus, the turret 30 has twenty-four detent stop positions for each revolution. However, a different number of stop positions may be provided if desired. The cooperation of the spiral groove 38 and the projection 42 allows the turret 30 to rotate through more than one revolution, thus enabling a separate detent stop position to be provided for each of the seventy channels in the UHF band. A detent spring 50 (FIG. 3) is permanently mounted on the front mounting plate 34. The detent spring 50 carries a detent wheel bracket 52 on which a detent wheel 54 is mounted to rotate about a detent wheel bracket pins 56. The spring pressure of the detent spring 50 causes the detent wheel 54 to bear against the detent notches 48 to resiliently stop and hold the rotary turret 30 in any one of the seventy detent stop positions. As the turret 30 is switched from one detent stop position to the next, the wheel 54 follows he contour of the detent notches 48. Thus, by turning the knob 22, motion is translated through the hub 32 to the turret 30 so as to switch the tuner 20 from one channel to the next. Having twenty-four detent notches 48, the turret 30 may be detented 24 times per revolution.

Figures 4, 5, 6:
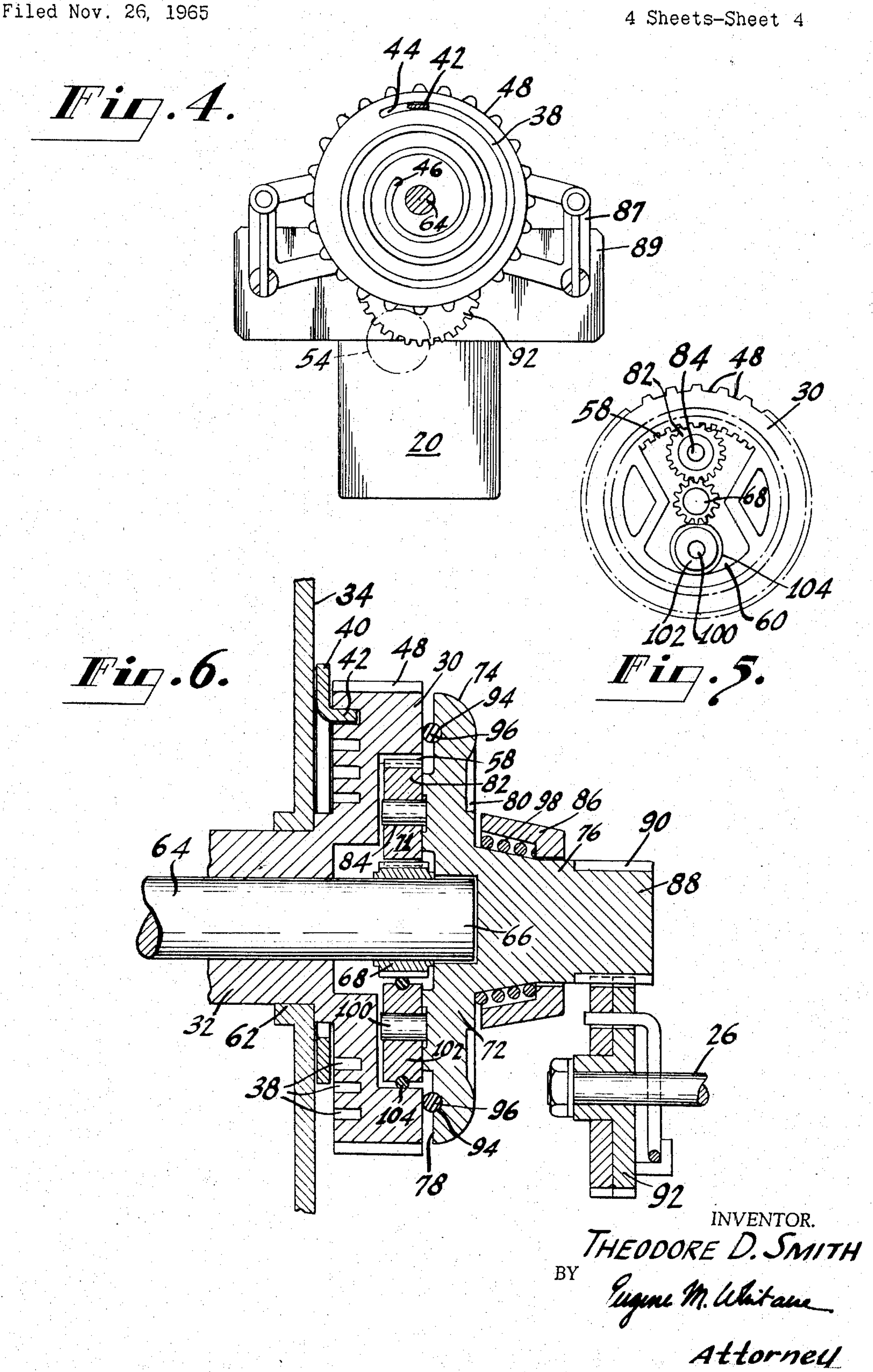
FIGURE 4 is a sectional view of the tuning mechanism taken on section lines 4—4 of FIGURE 2.
FIGURE 5 is a sectional view of the tuning mechanism taken on section lines 5—5 of FIGURE 2.
FIGURE 6 is an enlarged cross-sectional view of the turret and planetary gear mechanism of FIGURE 2.

As can be seen in FIGURES 5 and 6, as an integral part of the turret 30 and recessed in the face thereof furthest from the front plate 34 is an internal ring gear segment 58 and a radial sector 60 opposed 180° from the ring gear segment 58. The radius from the axis of the turret 30 to the surface of the sector 60 is the same as the inside radius from the axis to the internal gear tooth of segment 58.

The face of the turret 30 nearest plate 34 carries the hub 32 which extends through an opening 62 (FIG. 6) in the plate 34. The hub 32 acts as a bearing surface for the turret 30 and is also used to attach the knob 22 for directly rotating the turret. Passing through the hub 32 is a shaft 64 which uses the hub 32 as a bearing surface so that the knob 24 may be attached for fine tuning. Affixed near an end 66 of the shaft 64 is a sun gear 68 which comprises a portion of a differential gearing system shown in the preferred embodiment of the drawings as a planetary differential gearing system 71. However, other types of differential gearing systems may be employed.

The planetary gearing system 71 has a planetary carrier 72 which includes circular disk 74 and a support 76. The disk 74 has an inner face 78, which lies immediately adjacent the turret 30, and an outer face 80 from which the support 76 extends horizontally. Situated above and meshing with the sun gear 68 is a planetary gear 82 which also meshes with the internal ring gear segment 58. Gear 82 is affixed to rotate freely on the inner face 78 of the carrier 72 by means of a pin 84. The support 76 of the planetary carrier 72 extends laterally through a bearing 86 which is carried in a yoke 87 (see FIG. 4) which assists in supporting the turret 30 and the planetary carrier 72. The yoke 87 is affixed to the front mounting plate 34 and to a rear mounting plate 89 through which the tuner shaft 26 passes. Affixed to an end 88 of the support 76 is an output pinion 90 which is used to drive a scissor gear 92 which is mounted on the tuner shaft 26. The inner face 78 of the planetary carrier 72 also has an annular groove 94 near the outer edge thereof which holds a resilient O-ring 96. The O-ring 96 may be made of any resilient material, such as rubber or the like. A spring 98, which surrounds the support 76 of the carrier 72 and which is confined between the bearing 86 and the support 76, biases the O-ring 96 against the adjacent face of the turret 30. The O-ring 96 biased against the turret 30 acts as a clutch means to couple rotation of the planetary carrier 72 with that of the ring gear segment 58. Also affixed to rotate freely on the planetary carrier 72 by means of a pin 100 is a grooved wheel 102 which carries a resilient O-ring 104 around its periphery. O-ring 104 is positioned to roll in compression between the sun gear 68 and the radial sector 60 of the turret 30. The wheel 102 is utilized to reduce any backlash between the sun gear 68 and the planetary carrier 72.

An indicator mechanism 28 is provided to indicate the channel setting of the tuner 20 and includes the following elements. The face plate 36 has an opening or window 106 in the upper portion thereof. Spaced from and on the side of the face plate 36 opposite from that on which knobs 22 and 24 are located are a pair of indicia carriers which are shown as back-to-back disks 108 and 110. The disks 108 and 110 each carry the numbers 0 through 9 evenly spaced around the periphery thereof. The disk 110 is used to represent the ones units while the disk 108 represents the tens or decade units. Both disks 108 and 110 have an axial pin 112 which passes through their centers and which is affixed to the front mounting plate 34. The disks 108 and 110 are mounted for rotation so that the numbers appearing around their peripheries are viewable through the window 106 in the face-plate 36. The disk 108 is transparent with numerals hot stamped on the rear side in such a manner that they fall on the left side of the window 106 and the disk 110 is translucent with numerals stamped on the front side in a manner that they will fall on the right-hand side of the window 106. The front mounting plate 34 has an oblique extension 114 on the upper end thereof which curves away from the faceplate 36. Mounted on the extension 114 is a light source 116 which in the present embodiment takes the form of a small light bulb. However, any other suitable source of light could be employed. Electrical connection is made to the light source 116 via terminals 118 projecting through the underside of the extension 114. The light source 116 is employed to illuminate the channel numbers from the rear.

The disks 108 and 110 are rotated from one channel number to the next by a gearing assembly 120 as shown fully in FIGURES 2 and 3. The entire gearing assembly 120 is vertically positioned between the disks 108 and 110 and the front mounting plate 34. The gearing assembly 120 includes a toothed wheel 122 which is mounted on the hub 32. Toothed wheel 122 rotates as the knob 22 rotates the turret 30 from one detent stop position to the next. Mounted for rotation independently of the pin 112 is a second toothed wheel 124, smaller in diameter than the tooth wheel 122. The teeth of wheels 122 and 124 mesh and a 1-to-2.4 (15°–36°) gear reduction is provided between these gears. Wheel 124 is fixed on the back side of the disk 110 so that they rotate together. Affixed to the back of wheel 124 is a gear 126 which also rotates when the disk 110 and the wheel 124 rotate. Mounted for rotation about the pin 112 between the gear 126 and the front mounting plate 34 are a star wheel 128 and a detent plate 130 which are fixed together to rotate as a single unit. The star wheel 128 has an axially extending tubular shaft concentric with the pin 112 which passes through the center hole of the units disk 110 and acts as a bearing therefor. The tens disk is suitably affixed to the forward end of the axially extending shaft so that rotation of the star wheel 128 causes rotation of the disk 108.

Situated directly beneath the gear 126 is an idler gear 132 which is mounted for rotation about a pin 134 which is fixed to the front mounting plate 34. The teeth of gears 126 and 132 mesh. Integral with one of the teeth of gear 132 is a projection 136, which, once every complete revolution of the gear 132, meshes with the teeth of the star wheel 128 to form a Geneva gear system. The star wheel 128 has nine teeth 138, and the detent plate 130 has nine detented stops 140 so that there is a corresponding tooth of the star wheel 128 for each detented stop of the detent plate 130. The idler gear 132 has a rearwardly extending hub which is received in the notched portions 140 of the detent plate 130 (see FIG. 3), to detent and maintain synchronism between the disks 108 and 110. A portion of the idler gear 132 hub is relieved or flattened to allow the star wheel 128 and tens disk 108 to rotate when engaged by the single tooth 136 of the idler gear 132. To hold the detent plate 130 in each detented stop 140 there is a spring 141 having a curved portion 143 which rests in detented stops 140. The spring 141 is fixed to the mounting plate 34 by a screw 145 which passes through the plate 45 and into the yoke 87.

The indicating mechanism 28 operates in the following manner. As the knob 22 is rotated to switch the turret 30 from one detent stop position to another, the toothed wheel 122 rotates with the hub 32 so as to rotate the toothed wheel 124 and the disk 110, thereby changing the ones unit of the channel numbers. The detenting of the turret 30 fixes the stop positions of the disk 110. Viewing the window 106 reveals the change from one channel number to the next successive channel number either higher or lower depending on whether the knob 22 is rotated clockwise or counterclockwise. As the wheel 124 and the disk 110 rotate, the gear 126 rotates the idler gear 132. With each revolution of the disk 110, the projection 136 on the idler gear 132 comes into contact with a tooth 138 of the star wheel 128, and causes the star wheel 128 and detent plate 130 to move simultaneously to the next detented stop 140. When this movement of the star wheel 128 and the detent plate 130 takes place, the disk 108 which carries the tens units also rotates to display the next successive decade of channel numbers. For example, if channel number 29 is indicated, switching of the knob 22 to rotate the turret 30 to the next detent stop position towards the next ascending channel number, causes movement of the gear 126 and the star wheel 128, whereby both of the disks 108 and 110 rotate to provide an indication of channel number 30.

The operation of the turret 30 and the planetary gearing system 71 is as follows. In any planetary system if the sun gear is fixed so that it cannot rotate when the ring gear is rotated, the planetary carrier will rotate in the same direction as the ring gear due to the interaction of the ring gear, and planetary gear moving around the fixed sun gear. The rate at which the planetary carrier moves with respect to the ring gear is determined by the ratios of pitch diameters of the sun, planetary and ring gears.

If in a planetary system, with the ring gear used as an input, the sun gear floating, and the planetary carrier used as the output, when there is an output load great enough to overcome the friction in the gear train, the planetary carrier would remain stationary and the sun gear would rotate in a direction opposite to the direction of the ring gear at a rate determined by the ratio of pitch diameters of the ring, sun and planetary gears.

In the present embodiment, the internal ring gear segment 58 is used as an input, the sun gear 68 is in a floating capacity and the planetary carrier 72 is used as the output. When the turret 30 is advanced one detent stop position by means of the knob 22, it rotates through a 15° arc. Since the planetary carrier 72 is biased against the face of the turret 30 by the O-ring 96 and the spring 98, the turret 30 and the planetary carrier 72 rotate as a unit, bypassing the planetary gearing system 71. Since the gear ratio between the output pinion 90 and the scissor gear 92 is 3-to-1, the gear 92 will move through 5°. There is another 2-to-1 gear reduction inside the tuner itself (not shown) so that there will be a resultant 2.5° rotation of the tuner shaft 26. That is the amount of rotation necessary to move from one channel to the next if the tuner were perfectly linear. Thus, between the input at the turret 30 and the tuner shaft there is a 6-to-1 ratio (15° to 2.5°). Therefore, the turret 30 will move a total of $70\times15°=1050°$ for the 175° of rotation necessary to cover the 70 channels at the tuner shaft 26.

Since the tuner may not be perfectly linear, there must be some provision for adjustment at each one of the seventy detent stop positions. In the present embodiment of the invention, the turret 30, which has as an integral part thereof, the ring gear segment 58, can be considered to be a fixed member when it is in any detent stop position. The sun gear 68 then becomes the input and the planetary carrier 72 is the output. When the sun gear shaft 64 is rotated by means of the knob 24 the detent spring 50 and detent wheel 54 provide a sufficient force to hold the turret 30 fixed. The O-ring 96 on the planetary carrier 72 will slip at the interface of the O-ring 96 and the turret 30, and allow the planetary carrier 72 to rotate at a slower rate than the input at the sun gear shaft 64 due to the gear reduction in the planetary gearing system 71. There is a gear ratio of 5-to-1 between the sun gear shaft 64 and the output pinion 90. Th?re is an additional 6-to-1 ratio between the output pinion 90 and the tuner shaft 26 as mentioned previously. Therefore, the total gear ratio between the sun gear shaft 64 and the tuner shaft 26 is 30-to-1, which provides adequate fine tuning.

It is necessary to have only a segment of the ring gear 58 on the turret 30 since the planetary gearing system 71 rotates as a unit when the turret 30 is detented. The number of degrees of gear segment is determined by the amount the tuner alignment curve will deviate from being linear. In practice it is in the order to 10 mc., at the high end of the band or about 1½ channels. A gear segment that allows a two channel range for fine tuning in such a case is sufficient. Therefore, a total of 150° of rotation is allowed on the sun gear shaft 64 for fine tuning.

The television tuner mechanism of the present invention provides a compact, economical and improved channel tuner mechanism for a step-by-step UHF tuner, capable of providing a detented type drive for each and every channel of the seventy UHF channels. In addition to the positive det?nted action in switching from one channel to the next, the mechanism provides for fine tuning between channels, and also an indicating assembly which provides a clear and visible indication of the channel number being selected.

Various modifications are contemplated and may obviously be resorted to by those skilled in the art without departing from the spirit and scope of the invention, as hereinafter defined by the appended claims, as only a preferred embodiment thereof has been disclosed.

What is claimed is:

1. An ultrahigh frequency television tuning and indicating mechanism providing step-by-step tuning and indication of ultrahigh frequency television channels comprising:

an ultrahigh frequency television tuner having a tuning shaft adjustable to tune said ultrahigh frequency tuner to any of said ultrahigh frequency television channels, a rotatable member, detent means coupled to said member for providing a plurality of stop positions for said member, control means coupled to said member for rotating said member from one stop position to the next, means for coupling said member to said tuning shaft to tune said tuner from one channel to the next as said member is moved from one stop position to the next, indicating means including a first indicia carrier for displaying the unit numbers of said television channels and a second indicia carrier for displaying the decade numbers of said television channels, said first and second carriers relatively positioned to provide a composite channel number indication at a predetermined viewing location, means coupling said first carrier with said member to move said first carrier as said member rotates to cause sucessive unit numbers to be displayed at said viewing location as said member is moved from one stop position to the next and to detent said first carrier with the detent means for said member, Geneva gear means coupling said member to said second carrier to move said second carrier after a predetermined number of movements of said member to cause successive decade numbers to be displayed at said viewing location in accordance with the decade number of a channel to which said ultrahigh frequency tuner is tuned, and second detent means coupled to said second carrier to provide a stop position at each of said decade number viewing positions.

2. An ultrahigh frequency television tuning and indicating mechanism as set forth in claim 1 wherein:

said means for coupling rotation of said member to said tuning shaft includes a differential gearing system connected to said member, said gearing system capable of rotating as a unit with said member in detenting from one stop position to the next and also capable of operation independent of said member to provide fine tuning of a channel between stop positions, and a fine tuning control means is provided for adjusting said gearing system to provide fine tuning of a channel.

3. An ultrahigh frequency television tuning and indicating mechanism as set forth in claim 2 wherein said differential gearing system is a planetary gearing system comprising:

a ring gear integral with said member, means providing another member coupled to said tuning shaft and including a planetary gear coupled to said ring gear, clutch means coupling said another member to said ring gear for rotation with said ring gear to tune said tuner from one channel to the next as said ring gear is moved from one stop position to the next, a sun gear coupled to said planetary gear, and means are provided for rotating said sun gear to translate motion through said planetary gear to said another member to cause said another memebr to rotate relative to said ring gear against the friction of said clutch means to provide fine tuning of said tuner.

4. An ultrahigh frequency television tuning and indicating mechanism as set forth in claim 1 wherein:

said member includes a ring gear, means are provided for providing another member coupled to said tuning shaft and including a planetary gear coupled to said ring gear, clutch means are provided for coupling said another member to said ring gear for rotation with said ring gear to tune said tuner from one channel to the next as said ring gear is moved from one stop position to the next, a sun gear is provided for coupling to said planetary gear, and means are provided for rotating said sun gear to translate motion through said planetary gear to said another member to cause said another member to rotate relative to said ring gear against the friction of said clutch means to provide fine tuning of said tuner.

5. An ultrahigh frequency tuning mechanism as set forth in claim 1 wherein:

said member comprises a rotary turret, and said first mentioned detent means comprises a plurality of detent notches spaced around the periphery thereof, and the plurality of stop positions for said turret provide a separate equally, spaced detent stop position for each of the seventy channels in the ultrahigh frequency range.

6. An ultrahigh frequency tuning and indicating mechanism as defined in claim 1 including:

an idler gear, means coupling said first carrier to drive said idler gear, said Geneva gear means including a first gear operatively coupled to drive said second carrier and a second gear driven by said idler gear, said second gear having at least one driving tooth and an axially extending hub with a flat at the location of said driving tooth, said second detent means including a plate having a plurality of peripheral notches, said plate being coupled to said first gear, said plate being positioned so that said axially extending hub is received in said notches to detent and prevent movement of said plate except when said driving tooth engages said first gear.

7. An ultrahigh frequency television tuning mechanism comprising in combination:

an ultrahigh frequency television tuner having a tuning shaft adjustable to tune said tuner to any of a plurality of ultrahigh frequency television channels, a first gear, control means for rotating said first gear, detent means coupled to said first gear to provide a plurality of stop positions, means providing a member coupled to said tuning shaft, friction clutch means coupling said member to said first gear for rotation therewith to tune said tuner from one channel to the next as said first gear is moved from one stop position to the next, a second gear, a third gear mounted on said member and interposed between said first gear and said second gear, and means for rotating said second gear to translate motion through said third gear to said member to cause said member to rotate relative to said first gear against the friction of said clutch means to provide fine tuning of said tuner.

8. An ultrahigh frequency television tuning and indicating mechanism providing step-by-step tuning and indication of ultrahigh frequency television channels comprising:

an ultrahigh frequency television tuner having a tuning shaft adjustable to tune said ultrahigh frequency tuner to any of said ultrahigh frequency television channels, a rotatable member, detent means coupled to said member for providing a plurality of detent stop positions for said member, control means coupled to said member for rotating said member from one detent stop position to the next, first, second and third gear means forming a differential gearing system with said second gear interposed between and meshing with said first and third gears, a support member for said second gear coupled to said tuner shaft, clutch means interposed between said support member and said rotatable member to cause said support member to rotate when said rotatable member is rotated, indicating means including a first indicia carrier for displaying the unit numbers of said television channels and a second indicia carrier for displaying the decade numbers of said television channels, said first and second carriers relatively positioned to provide a composite channel number indication at a predetermined viewing location, means coupling said first carrier with said member to move said first carrier as said member rotates to cause successive unit numbers to be displayed at said viewing location as said member is moved from one detent stop position to the next and to detent said first carrier with the detent means for said member, Geneva gear means coupling said member to said second carrier to move said second carrier after a predetermined number of movements of said member to cause successive, decade numbers to be displayed at said viewing location in accordance with the decade number of a channel to which said ultrahigh frequency tuner is tuned, means for rotating said third gear means to translate motion through said second gear means to said support member to cause said support member to rotate relative to said rotatable member and provide incremental adjustment of said tuner shaft without affecting the detented position of said first and second carriers, and second detent means coupled to said second carrier to provide a stop position at each of said decade number viewing positions.

9. An ultrahigh frequency television tuning mechanism as defined in claim 8 wherein said first mentioned detent means providing a number of stop positions per revolution of said rotatable member which is less than the number of said plurality of ultrahigh frequency television channels, limiting means coupled to said rotatable member to limit the number of revolutions of said rotatable member so that the rotatable member has a total number of stop positions rotating in one direction from a first limit to a second limit which corresponds to the number of said plurality of ultrahigh frequency television channels.

10. A television tuning mechanism as set forth in claim 9 wherein:

said first mentioned detent means includes a plurality of detent notches equally spaced around the periphery of said rotatable member, a mounting plate, a detent spring and wheel secured to said plate, said detent wheel being provided to rest in said detent notches under the pressure of said spring as said turret is rotated, and said limiting means includes a projection movably secured to said plate, said projection being carried in a spiral groove situated in one face of said rotatable member whereby when said turret is rotated the curvature of said spiral groove is followed by said projection so as to permit a separate detent stop position for each of the seventy channels in the ultra-high frequency range.

References Cited

UNITED STATES PATENTS

| | | | |
|---|---|---|---|
| 2,780,200 | 2/1957 | Winters | 74—10.52 X |
| 3,152,487 | 10/1964 | Kennedy | 74—10.41 |
| 3,307,414 | 3/1967 | Naber et al. | 74—10.41 |

MILTON KAUFMAN, *Primary Examiner.*